United States Patent
Masuda

(10) Patent No.: US 9,007,152 B2
(45) Date of Patent: Apr. 14, 2015

(54) TRANSMISSION LINE, IMPEDANCE TRANSFORMER, INTEGRATED CIRCUIT MOUNTED DEVICE, AND COMMUNICATION DEVICE MODULE

(75) Inventor: Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 586 days.

(21) Appl. No.: 13/306,641

(22) Filed: Nov. 29, 2011

(65) Prior Publication Data

US 2012/0193771 A1  Aug. 2, 2012

(30) Foreign Application Priority Data

Jan. 27, 2011  (JP) ................................ 2011-015215

(51) Int. Cl.
*H03H 7/38* (2006.01)
*H01L 23/66* (2006.01)
*H01P 5/12* (2006.01)
*H03F 3/60* (2006.01)

(52) U.S. Cl.
CPC .. *H01P 5/12* (2013.01); *H03H 7/38* (2013.01); *H03F 3/602* (2013.01); *H01L 23/66* (2013.01); *H01L 2223/6627* (2013.01); *H01L 2223/6655* (2013.01); *H01L 2224/49175* (2013.01); *H01L 2924/30107* (2013.01); *H01L 2924/3011* (2013.01)

(58) Field of Classification Search
CPC .................................. H03H 7/38; H01L 23/66
USPC .............. 333/33, 34, 238, 246, 247; 257/701, 257/702, 704, 664, 690
See application file for complete search history.

(56) References Cited

U.S. PATENT DOCUMENTS

| | | | |
|---|---|---|---|
| 4,386,324 A * | 5/1983 | Schellenberg | ................ 330/277 |
| 5,132,641 A | 7/1992 | Khandavalli | |
| 5,973,567 A | 10/1999 | Heal et al. | |
| 2002/0186091 A1 | 12/2002 | Maeda et al. | |
| 2011/0204993 A1 | 8/2011 | Masuda | |

FOREIGN PATENT DOCUMENTS

| | | |
|---|---|---|
| EP | 0680141 A1 | 11/1995 |
| JP | S57-037903 | 3/1982 |
| JP | 57-138422 U | 8/1982 |
| JP | 63-99604 A | 4/1988 |
| JP | 2-98503 U | 8/1990 |
| JP | H10-284920 | 10/1998 |

(Continued)

OTHER PUBLICATIONS

Cohn, Seymour B. "Optimum Design of Stepped Transmission-Line Transformers", IRE trans. MTT-3, Apr. 4, 1995, pp. 16-21.

(Continued)

*Primary Examiner* — Stephen E Jones
(74) *Attorney, Agent, or Firm* — Fujitsu Patent Center

(57) ABSTRACT

A transmission line includes two tapered lines having a tapered planar shape and arranged in parallel, opposite lines provided in opposition to the narrower width sides of the two tapered lines, and a bonding wire for connecting the narrower width sides of the two tapered lines and the opposite lines, wherein the width between two outer edges on the narrower width sides of the two tapered lines arranged in parallel is greater than the width between outer edges on the opposite side of the opposite lines in opposition to the narrower width sides of the two tapered lines.

14 Claims, 13 Drawing Sheets

(56) References Cited

FOREIGN PATENT DOCUMENTS

| JP | H11-122009 | 4/1999 |
|----|------------|--------|
| JP | 3303845 B2 | 5/2002 |
| JP | 2002-335136 | 11/2002 |

OTHER PUBLICATIONS

"Extended European Search Report" mailed by EPO and corresponding to European application No. 11190255.7 on Jul. 31, 2012.
Chinese Office Action of Chinese Patent Application 201110384574.X dated Feb. 28, 2014, with English Translation, 18 pages.
Korean Office Action mailed May 2, 2013 for corresponding to Korean Application No. 10-2011-125693, with English-language Translation.
TWOA—Official Letter of Taiwan Patent Application No. 100143705 dated Oct. 27, 2014, with partial English Summary of the Official Letter.
JPOA—Office Action of Japanese Patent Application 2011-015215 dated Aug. 26, 2014, with English translation of the relevant part, p. 1, line 20 to p. 3, line 30 of the Office Action.

\* cited by examiner

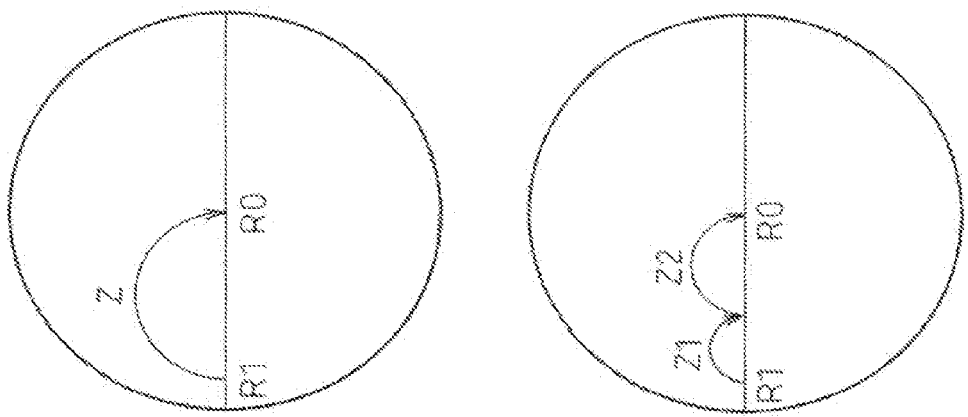
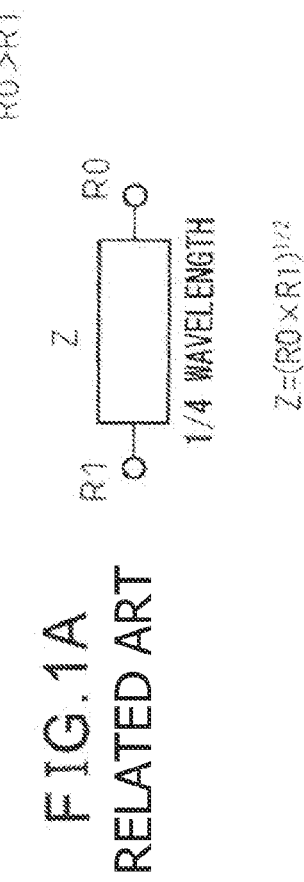
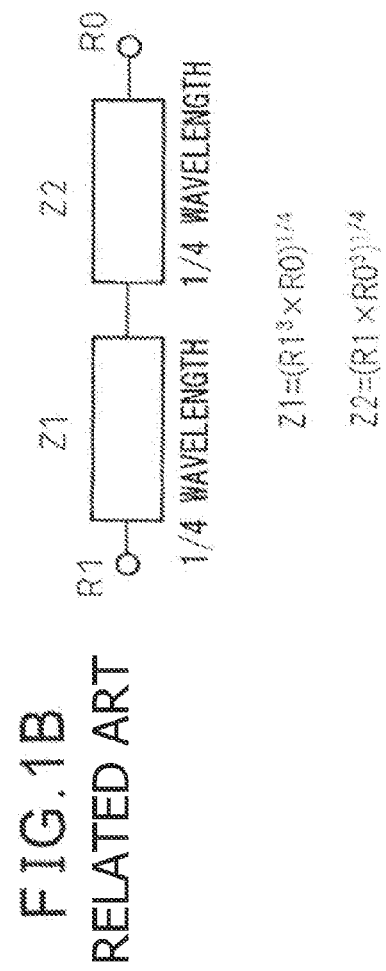
FIG. 1A
RELATED ART
FIG. 1B
RELATED ART

TRANSMISSION LINE, IMPEDANCE TRANSFORMER, INTEGRATED CIRCUIT MOUNTED DEVICE, AND COMMUNICATION DEVICE MODULE

CROSS-REFERENCE TO RELATED APPLICATIONS

This application is based upon and claims the benefit of priority of the prior Japanese Patent Application No. 2011-015215, filed on Jan. 27, 2011, the entire contents of which are incorporated herein by reference.

FIELD

The embodiments discussed herein are related to a transmission line, an impedance transformer including a transmission line, an integrated circuit mounted device including an impedance transformer, and a communication device module including an integrated circuit mounted device.

BACKGROUND

Recently, a high-output integrated circuit device that mounts an integrated circuit chip including a high-output transistor is demanded for a mobile telephone base station or radar. In such an integrated circuit mounted device, high-output characteristics are realized by arranging in parallel a plurality of power transistors formed on an integrated circuit chip on a metal package and forming an impedance transformer by a line on a dielectric substrate for impedance matching.

In order to form a wideband matching circuit, an impedance transformer is utilized, in which a plurality of ¼ wavelength lines is connected in series so as to keep a Q value small. Such an impedance transformer is used widely in an integrated circuit mounted device that requires wideband characteristics because the wideband characteristics may be obtained by increasing the number of stages of the ¼ wavelength line. When configuring a ¼ wavelength impedance transformer, a transmission line having a desired characteristic impedance is formed with the substrate thickness of the wire, the dielectric constant of the substrate, and the wire width being taken into consideration.

FIGS. 1A and 1B are diagrams explaining impedance conversion, wherein FIG. 1A illustrates a case of matching with one stage and FIG. 1B illustrates a case of matching with two stages. It is assumed that the output impedance of a transistor is R1, the input impedance in the subsequent stage is R0, and R0>R1 holds. When performing matching with one stage as illustrated in FIG. 1A, one ¼ wavelength line having a characteristic impedance Z is used and it is set as $Z=(R0 \times R1)^{1/2}$. In contrast to this, when performing matching with two stages as illustrated in FIG. 1B, a ¼ wavelength line having a characteristic impedance Z1 and a ¼ wavelength line having a characteristic impedance Z2 are connected in series and they are set as $Z1=(R1 \times R0)^{1/4}$ and $Z2=(R1 \times R0^3)^{1/4}$. There is a case where ¼ wavelength lines in three or more stages are connected in series.

In a high-output integrated circuit mounted device, the gate width of a transistor is increased in order to increase the output. The increase in the gate width of a transistor may be realized by using a plurality of transistors having the same characteristics in parallel and connecting the outputs of the plurality of transistors commonly. If the gate width of the transistor is increased in this manner, the output impedance of the transistor is reduced to 1Ω or less. In order to increase the output of the transistor to the maximum, the output impedance of several ohms is converted into 50Ω used normally and to perform impedance matching. In this case, in order to secure the frequency band, as illustrated in FIG. 1B, a plurality of impedance transformers are connected in series and the impedance is converted into 50Ω stepwise for matching. The shape of the ¼ wavelength line, such as its length and width, is determined based on the dielectric constant, the impedance, etc., of the substrate. Because of this, a high-impedance line that uses a substrate with a low dielectric constant has a longer length and a wider width compared to a low-impedance line that uses a substrate with a high dielectric constant. As a result, there is such a problem that the size of the matching circuit is increased. Because of this, a pattern layout in which a long line is bent in wiring is used to downsize the matching circuit.

On the other hand, due to the recent development of broadband, the demand for large-capacity high-speed radio communication is increasing. It is expected that the third generation of the base station amplifier of a mobile telephone will become widely used in order to deal with a larger capacity and further the fourth generation will develop in the future. The new communication scheme (WiMAX) has been put into practical use and it is expected that an increase in capacity will develop. In such circumstances, a higher output, higher efficiency, wider band, and reduction in cost are demanded. On the other hand, for a radar amplifier, a higher output and wider band to improve performance, such as the extension of detection range and resolution, and further high efficiency to realize reduction in operation cost and downsizing of a cooler is demanded.

Furthermore, in a phased array radar, it is necessary to arrange radar elements including an amplifier in the form of an array in a narrow space, and therefore, further downsizing of an amplifier is demanded.

RELATED DOCUMENTS

[Patent Document 1] Japanese Laid-open Patent Publication No. H11-122009

[Patent Document 2] Japanese Laid-open Patent Publication No. H10-284920

[Patent Document 3] Japanese Laid-open Patent Publication No. S57-037903

[Non-Patent Document 1] S. B. Cohn, "Optimum Design of Stepped Transmission-Line Transformers", IRE trans. MTT-3, pp. 16-21, 1955.

SUMMARY

According to an aspect of the embodiments, a transmission line includes two tapered lines having a tapered planar shape and arranged in parallel, an opposite line provided in opposition to the narrower width sides of the two tapered lines, and bonding wires for connecting the narrower width sides of the two tapered lines and the opposite line, wherein the distance between two outer edges on the narrower width sides of the two tapered lines arranged in parallel is greater than the distance between outer edges on the opposite side of the opposite line in opposition to the narrower width sides of the two tapered lines.

The object and advantages of the embodiments will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 1A and 1B are diagrams explaining impedance conversion;

DESCRIPTION OF EMBODIMENTS

Before explaining embodiments, the technology of increasing the output of and downsize of an integrated circuit mounted device will be explained.

Figure 2:
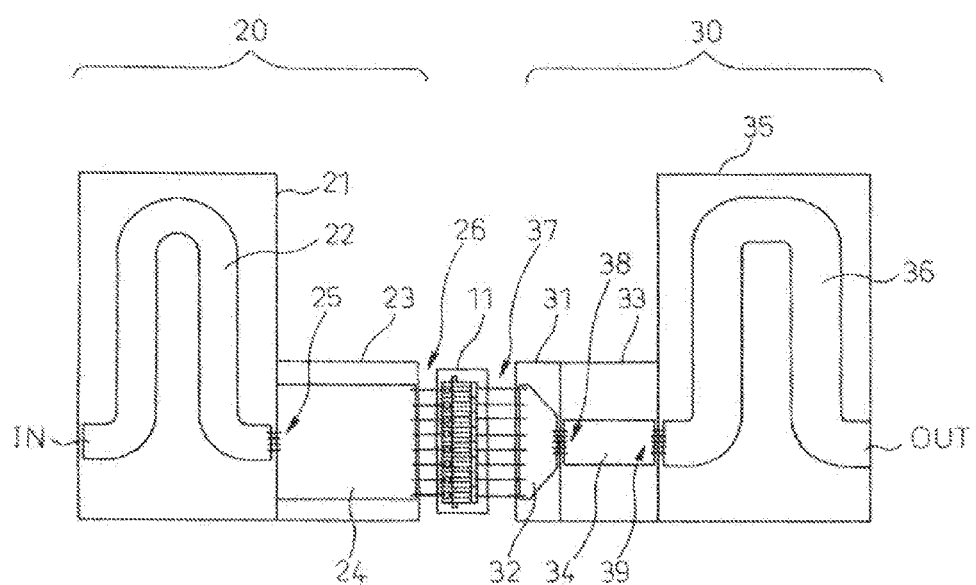
FIG. 2 is a diagram illustrating a conventional example of a matching circuit of a high-output integrated circuit mounted device including a line in a bent shape.

FIG. 2 is a diagram illustrating a conventional example of a matching circuit of a high-output integrated circuit mounted device including a line in a bent shape. In FIG. 2, an integrated circuit chip 11 includes a plurality of transistors. The left side of the integrated circuit chip 11 is an input matching circuit 20 and the right side is an output matching circuit 30. The input matching circuit 20 includes a ¼ wavelength line 22 in a bent shape formed on a substrate 21, a ¼ wavelength line in a linear shape formed on a substrate 23, bonding wires 25 for connecting the ¼ wavelength line 22 and the ¼ wavelength line 24, and bonding wires 26 for connecting the ¼ wavelength line 24 and the input terminal of the integrated circuit chip 11. An end part IN on the left side of the ¼ wavelength line 22 is an input part and which is connected to the terminal of the package of the integrated circuit mounted device with bonding wires, etc. The output matching circuit 30 includes an electrode 32 in a tapered shape formed on a substrate 31, a ¼ wavelength line 34 in a linear shape formed on a substrate 33, a ¼ wavelength line 36 in a bent shape formed on a substrate 35, bonding wires 37 for connecting the output terminal of the integrated circuit chip 11 and the electrode 32, bonding wires 38 for connecting the electrode 32 and the ¼ wavelength line 34, and bonding wires 39 for connecting the ¼ wavelength line 34 and the ¼ wavelength line 36. An end part OUT on the right side of the ¼ wavelength line 36 is an output part and which is connected to the terminal of the package of the integrated circuit mounted device with bonding wires etc. By using a line in a bent shape, it is possible to reduce the width of an integrated circuit mounted device in the direction in which a signal travels.

The connection is usually realized by bonding wires. For example, in the conventional example in FIG. 2, the integrated circuit chip 11 and the ¼ wavelength line 24, and the integrated circuit chip 11 and the ¼ wavelength line 32 are connected by eight bonding wires 26 and 37, respectively. Further, for the connection of the ¼ wavelength line 22 and the ¼ wavelength line 24, four bonding wires 25 are used and for the connection of the electrode 32 and the ¼ wavelength line 34 and the connection of the ¼ wavelength line 34 and the ¼ wavelength line 36, four bonding wires 38 and 39 are respectively used. The plurality of wires is bonded using the same bonding device with the bonding positions shifted in parallel. Consequently, the trace of the boded wire projected on the bonding plane (line) extends in parallel. Hereinafter, such a case is expressed by the wording "the wire is parallel".

In a high-output semiconductor circuit, a transistor chip in which power transistors formed on a semiconductor chip are arranged in parallel in a plurality of rows on a metal package is used. In order to extract the performance of the transistor, a matching circuit is arranged at the input/output of the transistor chip. The matching circuit is a line on a dielectric substrate and configured by an impedance converter and realizes high-output characteristics by impedance-matching the transistor.

In order to increase the output, the gate width of the transistor is made wider. By inputting the same signal into a plurality of transistors and commonly connecting the outputs of the plurality of transistors, the gate width of the transistor is substantially made wider and the increase in output is realized. At this time, the number of parallel connections of transistors within the chip is increased and a plurality of chips is arranged in an alignment manner to compose power. If the number of parallel connections of transistors within the chip is increased, the transverse width size of the chip is increased accordingly and the length between the output parts (pads) at both ends of the transistor chip is increased. Further, also when a plurality of chips is arranged in an alignment manner, the length between the output parts located at both ends is increased. It is desirable to form a matching circuit to extract an output from such a transistor chip or a plurality of chips without deteriorating the output performance of the transistor.

Figure 3:
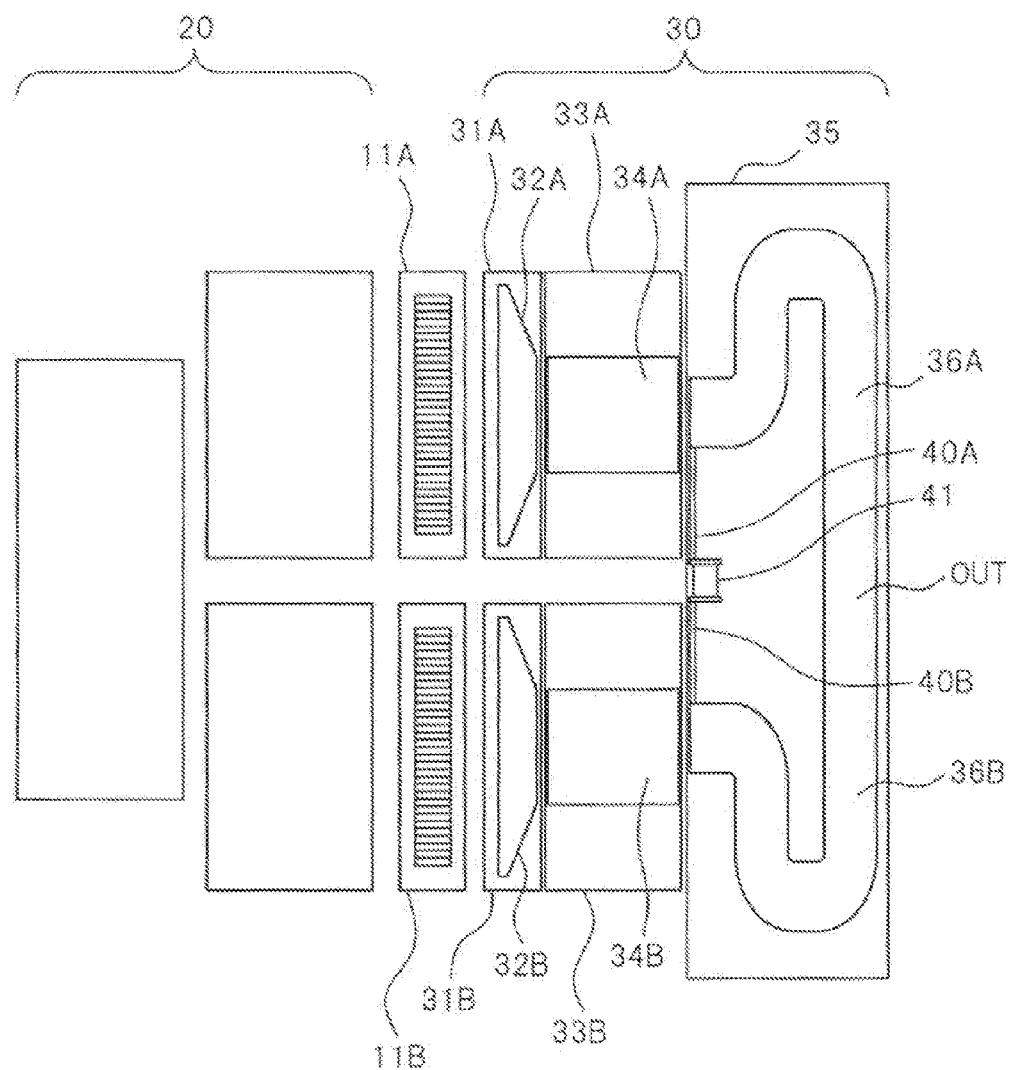
FIG. 3 is a diagram illustrating an example of a circuit arrangement supposed when an output matching circuit using two chips and having a line in a bent shape illustrated in FIG. 2 is applied.

FIG. 3 is a diagram illustrating an example of a circuit arrangement supposed when an output matching circuit using two chips and having a line in a bent shape illustrated in FIG. 2 is applied. It is desirable to consider an input matching circuit into consideration, however, the input matching circuit may be realized by, for example, arranging the output matching circuit in a symmetric manner, and therefore, in order to make explanation simple, only the output matching circuit is explained.

In FIG. 3, reference numeral 20 represents an input matching circuit and 30 an output matching circuit. As described above, explanation of the input matching circuit 20 is omitted.

As illustrated in FIG. 3, two chips 11A and 11B are arranged so that the output terminal of each transistor is arranged in a line, in other words, the chips 11A and 11B are arranged side by side.

The output matching circuit 30 has low dielectric constant substrates 31A and 31B, high dielectric constant substrates 33A and 33B, and the low dielectric constant substrate 35. On the low dielectric constant substrate 31A, a tapered line 32 having a tapered (trapezoidal) planar shape is formed. On the low dielectric constant substrate 31B, a tapered line 32B having a tapered (trapezoidal) planar shape is formed. On the high dielectric constant substrate 33A, a low impedance line 34A having a linear (rectangular) planar shape is formed. On the high dielectric constant substrate 33B, a low impedance line 34B having a linear (rectangular) planar shape is formed. On the low dielectric constant substrate 35, high impedance lines 36A and 36B for impedance-matching the outputs of the low impedance lines 34A and 34B and composing them at the out OUT are formed. It is desirable to insert a resistor between the inputs of the high impedance lines 36A and 36B to suppress trouble, such as circuit oscillation due to the variation in packaging. The positions of the input terminals of the high impedance lines 36A and 36B are apart, and therefore, connection lines 40A and 40B are extended from the input terminals of the high impedance lines 36A and 36B and connected with a resistor 41.

The wider width side (the longer base of the trapezoid) of the tapered line 32A is in opposition to the chip 11A and connected by the bonding wires. The wider width side (the longer base of the trapezoid) of the tapered line 32B is in opposition to the chip 11B and connected by the bonding wires. The length of the chip 11A and the width of the longer base of the tapered line 32A, and the length of the chip 11B and the width of the longer base of the tapered line 32B are substantially the same, and therefore, the bonding wires are parallel.

The narrower width side (the shorter base of the trapezoid) of the tapered line 32A is in opposition to the low impedance line 34A and connected by the bonding wire wires. The narrower width side (the shorter base of the trapezoid) of the tapered line 32B is in opposition to the low impedance line 34B and connected by the bonding wires. The width of the shorter base of the tapered line 32A and the width of the low impedance line 34A, and the width of the shorter base of the tapered line 32B and the width of the low impedance line 34B are substantially the same, and therefore, the bonding wires are parallel.

The low impedance line 34A is in opposition to the high impedance line 36A and connected by the bonding wires. The low impedance line 34B is in opposition to the high impedance line 36B and connected by the bonding wires.

Therefore, in the output matching circuit in FIG. 3, the bonding wires for connecting the lines are substantially parallel.

The widths and lengths of the tapered lines 32A and 32B, the low impedance lines 34A and 34B, and the high impedance lines 36A and 36B are determined to realize impedance matching according to the dielectric constant of the substrate.

As illustrated in FIG. 2 and FIG. 3, the tapered line formed on the low dielectric constant substrate has a tapered (trapezoidal) planar shape and at the end on the opposite side of the chip, the width of the wire is made narrower than the width size of the chip.

However, when the tapered line is used, the signal path length of the signal output from both end parts of the chip differs from that of the signal output from the chip center part. Therefore, at high frequencies in particular, the signals cancel each other out and it becomes difficult to extract a signal efficiently. As a result, the output, efficiency, and the frequency band are reduced. Further, it is difficult to fine-adjust the conventional circuit characteristic which impedes improvement of yields.

In the embodiment described below, a high-performance integrated circuit mounted device is provided, in which the difference in the signal path length between the signal output from both end parts of the chip and the signal output from the center part is reduced.

Figure 4:
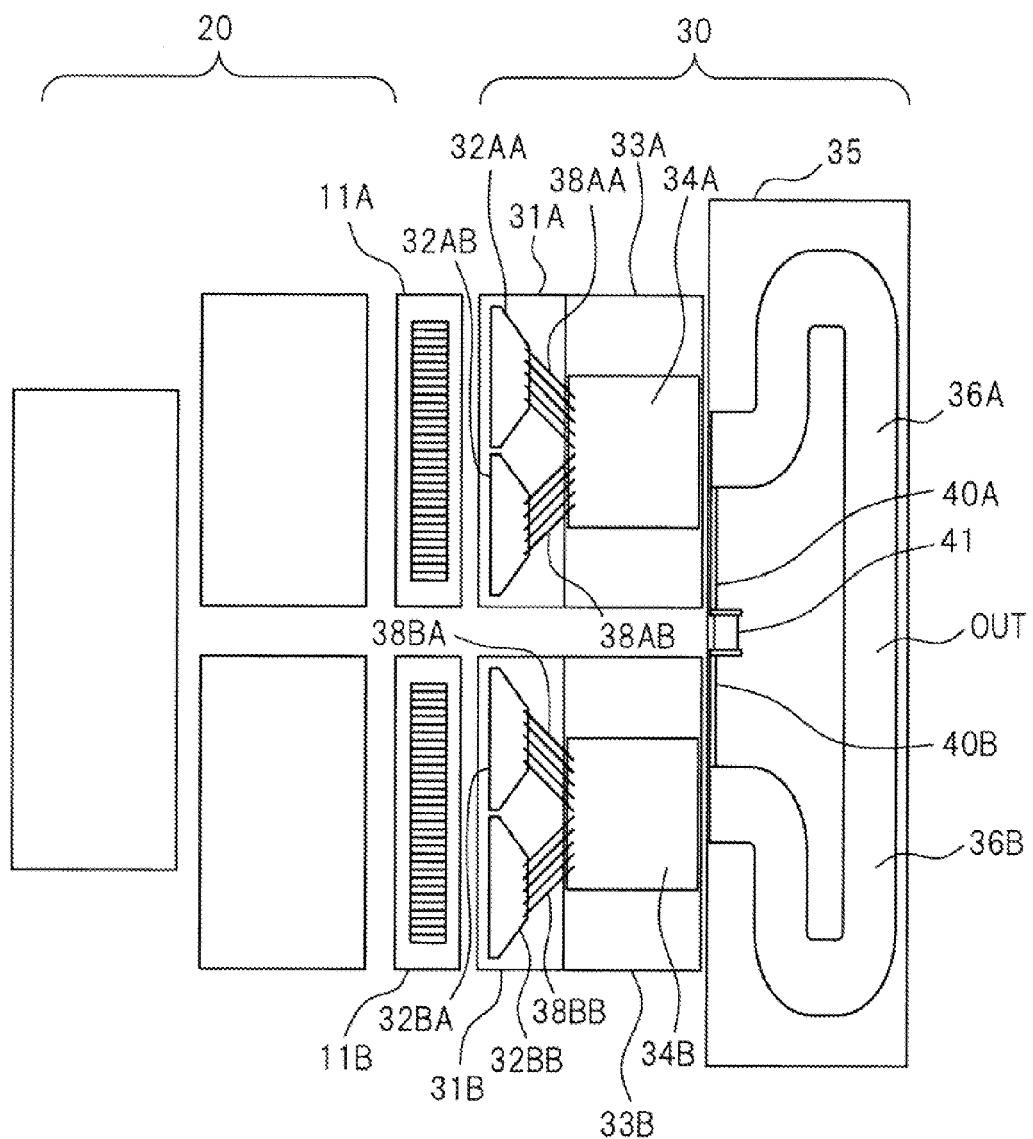
FIG. 4 is a diagram illustrating a circuit arrangement of an integrated circuit mounted device in a first embodiment.

FIG. 4 is a diagram illustrating a circuit arrangement of an integrated circuit mounted device in a first embodiment.

The circuit arrangement of the integrated circuit mounted device in the first embodiment has the two chips 11A and 11B in which a plurality of transistors is arrayed in the form of a row, the input matching circuit 20, and the output matching circuit 30. The signal input from the input terminal of the input matching circuit 20 is input to the inputs of the transistors of the two chips in parallel while the input matching circuit 20 is maintaining impedance matching. Consequently, the same signal is input to the plurality of transistors and the plurality of transistors outputs the same output in parallel and at the same time to the output matching circuit 30. The output matching circuit 30 composes the signals input in parallel from the two chips 11A and 11B while maintaining impedance matching and outputs it from the output terminal OUT. Due to this, the gate width of the transistor is increased substantially and high output is realized. As described above, any type of the input matching circuit 20 may be used and its explanation is omitted.

As illustrated in FIG. 4, the output matching circuit 30 has the low dielectric constant substrates 31A and 31B, the high dielectric constant substrates 33A and 33B, and the low dielectric constant substrate 35. On the low dielectric constant substrate 31A, two tapered lines 32AA and 32AB having a tapered (trapezoidal) planar shape are formed. On the low dielectric constant substrate 31B, two tapered lines 32BA and 32BB having a tapered (trapezoidal) planar shape are formed. On the high dielectric constant 33A, the low impedance line 34A having a linear (rectangular) planar shape is formed. On the high dielectric constant substrate 33B, the low impedance line 34B having a linear (rectangular) planar shape is formed. On the low dielectric constant substrate 35, the high impedance lines 36A and 36B are formed, which composes the outputs of the low impedance lines 34A and 34B after impedance-matching them at the output OUT. Further, on the low dielectric constant substrate 35, the connection lines 40A and 40B extending from the input terminals of the high impedance lines 36A and 36B and the resistor 41 connected between the connection lines 40A and 40B are arranged.

The wider width sides (the longer base of the trapezoid) of the two tapered lines 32AA and 32AB are arranged side by side in the direction perpendicular to the direction in which the signal travels and in opposition to the chip 11A and connected by bonding wires. The wider width sides (the longer base of the trapezoid) of the two tapered lines 32BA and 32BB are arranged side by side in the direction perpendicular to the direction in which the signal travels and in opposition to the chip 11B and connected by bonding wires. The length of the chip 11A is substantially the same as the sum of the widths of the longer bases of the two tapered lines 32AA and 32AB and the bonding wires are parallel. Similarly, the length of the chip 11B is substantially the same as the sum of the widths of the longer bases of the two tapered lines 32BA and 32BB and the bonding wires are parallel.

The narrower width sides (the shorter base of the trapezoid) of the two tapered lines 32AA and 32AB are in opposition to the low impedance line 34A and connected by bonding wires. The narrower width sides (the shorter base of the trapezoid) of the two tapered lines 32BA and 32BB are in opposition to the low impedance line 34B and connected by bonding wires.

The shorter bases of the two tapered lines 32AA and 32AB are arranged with a space and the distance between the upper end of the shorter base of the tapered line 32AA and the lower end of the shorter base of the tapered line 32AB is greater than the width of the low impedance line 34A. Because of this, bonding wires 38AA for connecting the tapered line 32AA and the low impedance line 34A and bonding wires 38AB for connecting the tapered line 32AB and the low impedance line 34A are not parallel. Specifically, the tapered line 32AA and the low impedance line 34A are connected by the five parallel wires 38AA and the tapered line 32AB and the low impedance line 34A are connected by the five parallel wires 38AB. However, the trace of the wire 38AA projected on the line plane extends in a direction different from a direction in which the trace of the wire 38AB projected on the line plane extends.

Similarly, the tapered line 32BA and the low impedance line 34B are connected by five parallel wires 38BA and the tapered line 32BB and the low impedance line 34B are connected by five parallel wires 38BB. However, the trace of the wire 38BA projected on the line plane extends in a direction different from a direction in which the trace of the wire 38BB projected on the line plane extends.

The low impedance line 34A is in opposition to the high impedance line 36A and connected by bonding wires. The low impedance line 34B is in opposition to the high impedance line 36B and connected by bonding wires. The high impedance line 36A and the high impedance line 36B are connected at the output terminal OUT and an output may be obtained therefrom.

The widths and lengths of the tapered lines 32AA, 32AB, 32BA, and 32BB, the low impedance lines 34A and 34B, and the high impedance lines 36A and 36B are determined to realize impedance matching according to the dielectric constant of the substrate.

As above, the circuit arrangement in the first embodiment differs from the circuit arrangement in FIG. 3 in that the tapered line is divided into two tapered lines and the shorter bases of the two tapered lines and the low impedance line are connected by the bonding wires extending in different directions and other parts are the same.

Figure 5A:
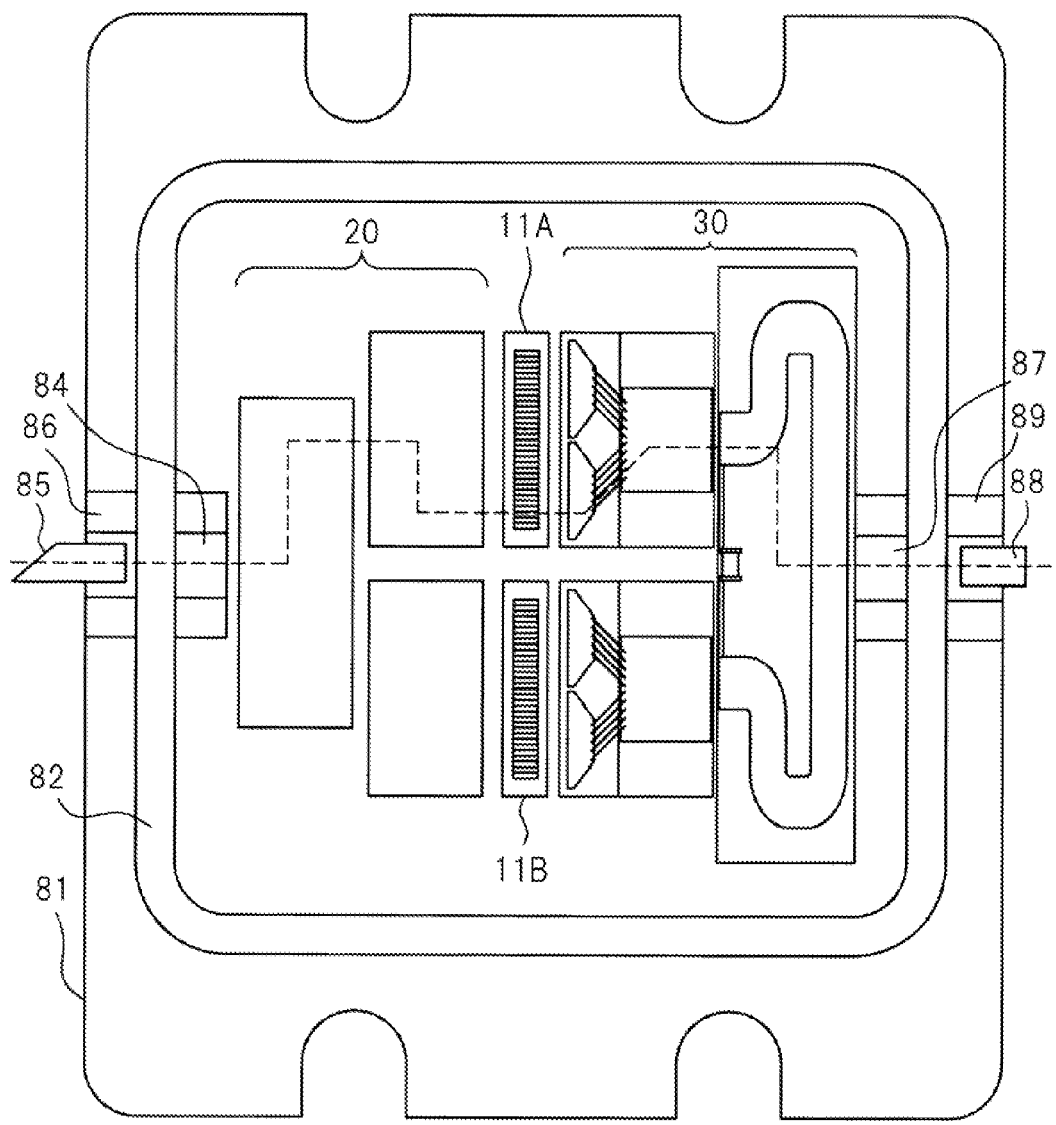
FIG. 5A is a top view of the integrated circuit mounted device in the first embodiment and FIG. 5B is a sectional view of a part along a broken line in the top view.
Figure 5B:
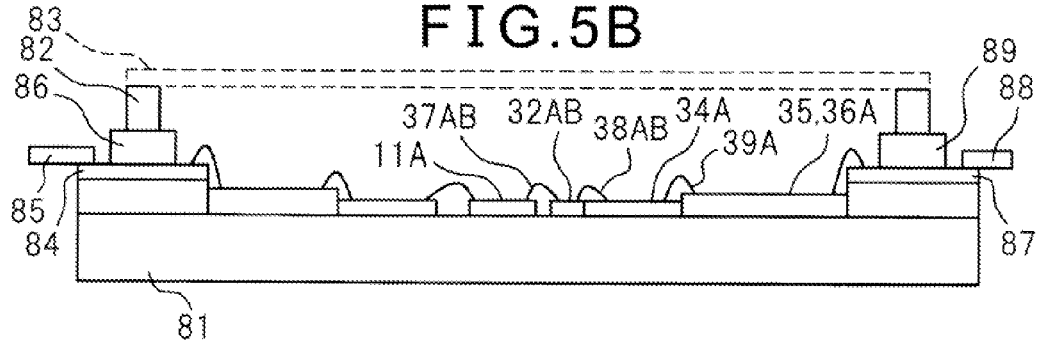

FIG. 5A is a top view of the integrated circuit mounted device in the first embodiment and FIG. 5B is a sectional view at the part of the broken line in the top view. FIGS. 5A and 5B illustrate a high-output amplifier circuit device mounting the circuit device in FIG. 4 in a hermetically sealed metal package having a metal wall.

The package is hermetically sealed by a metal wall 82 and a lid 83 on a metal base 81. For electrical connection with the outside, connection electrodes 84 and 87 are provided. The connection electrodes 84 and 87 are electrically insulated from the metal wall 82 and the lid 83 by field-throughs 86 and 89. On the part outside the package of the connection electrode 84, an input lead 85 is provided and on the part outside the package of the connection electrode 87, an output lead 88 is provided. The part within the package of the connection electrode 84 and an input part IN of the input matching circuit 20 are connected by a boding wire etc. The part within the package of the connection electrode 88 and the output part OUT of the output matching circuit 30 are connected by bonding wires etc.

On the metal base 81, two GaN (gallium nitride) power transistor (HEMT) chips and a matching circuit substrate (high dielectric substrate, low dielectric substrate) configuring an impedance converter are packaged in a nitrogen atmosphere at 300° C. using, for example, AuSn. It is possible to use a metal having a relative dielectric constant of 9.8 as the low dielectric constant substrates 31A, 31B and a metal having a relative dielectric constant of 140 as the high dielectric constant substrates 33A, 33B. Due to this, for example, in the output matching circuit 30, it is possible to form an impedance converter for converting the output impedance of the transistor into 50 ohm by a transmission line having a desired characteristic impedance. The low impedance lines 34A, 34B formed on the high dielectric constant substrates 34A, 34B are formed to have a wire width of 2.4 mm. The wires are arranged at regular intervals along the length of the shorter base of the tapered line and the wires are connected so as to be symmetric vertically (symmetric with respect to the line in the direction in which the signal travels) as to the low impedance lines 34A, 34B on the high dielectric constant substrates 33A, 33B with the wire intervals being maintained. By designing the configuration as such, it is possible to efficiently transmit signals from the substrates 31A, 31B to the substrates 33A, 33B by reducing a phase difference in the signals output from the transistors within the chips 11A and 11B. Further, not only by adjusting the wire inductance by changing the number of wires as before but also by changing the wire angle and the number of wires, the wire length may be changed in minute units, and therefore, it is possible to fine-adjust the circuit characteristics by fine-adjusting the wire inductance, also contributing to improvement of performance and yields.

The low impedance lines 34A, 34B are connected to the high impedance lines 36A, 36B of the low dielectric constant substrate 35. The low dielectric constant substrate 35 is a parallel line having a substrate thickness of 0.38 mm, a substrate dielectric constant of 9.8, and a wire width of 0.65 mm. It is possible to easily realize a transmission line of microwaves and millimeter waves by the micro strip line by making the back surface of the dielectric substrate a ground and the surface a signal wire, and therefore, design properties may be obtained.

In the above explanation, each line is connected by bonding wires, however, it is also possible to connect by a bonding ribbon. In this case also, the bonding ribbons for connecting the shorter bases of the tapered lines 32AA and 32AB and the low impedance line 34A extend in different directions. Further, the bonding ribbons for connecting the shorter bases of the tapered lines 32BA and 32BB and the low impedance line 34B extend in different directions.

Figure 6:
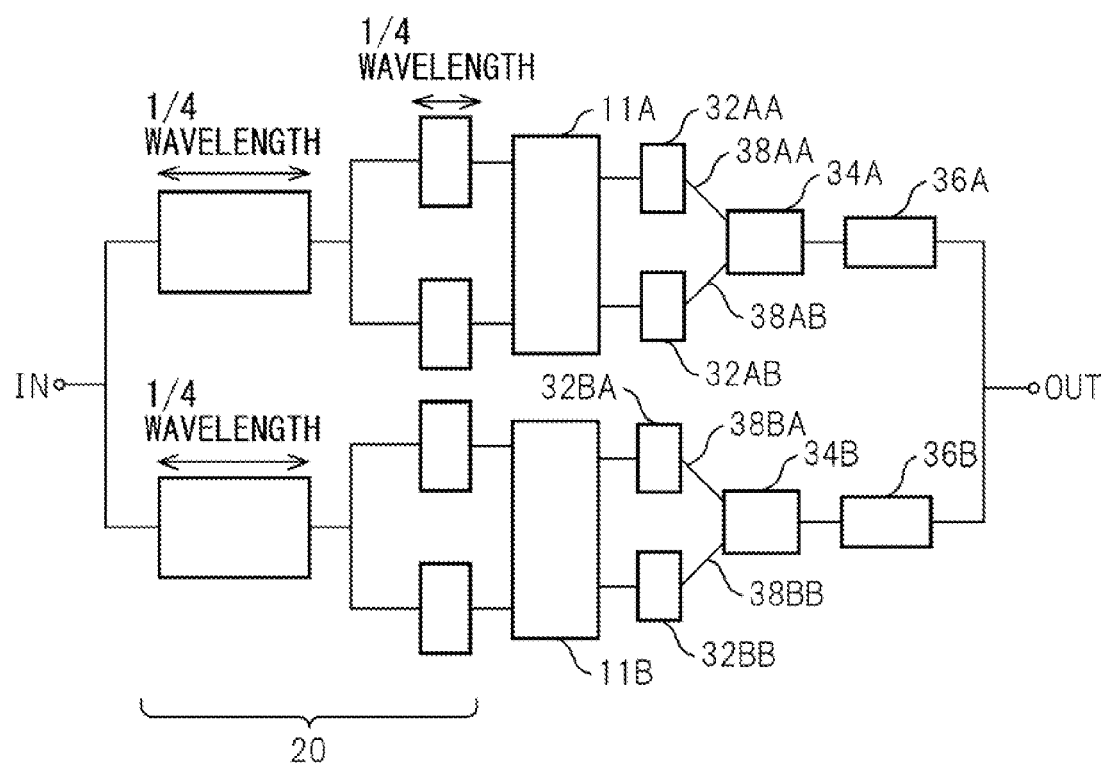
FIG. 6 is a diagram schematically illustrating an impedance conversion circuit of the integrated circuit mounted device in the first embodiment.

FIG. 6 is a diagram schematically illustrating the impedance conversion circuit of the integrated circuit mounted device in the first embodiment. To one of the integrated circuit chips 11A and 11B, the input matching circuit 20 is arranged and to the other, the output matching circuit 30 is arranged. The input matching circuit 20 performs impedance conversion through the ¼ wavelength circuit in two stages. Similarly, the output matching circuit 30 also performs impedance conversion through the ¼ wavelength circuit in two stages. The first stage of the output matching circuit 30 is formed by the tapered lines 32AA, 32AB, 32BA, and 32BB and the low impedance line 34 and the second stage by the high impedance lines 36A and 36B.

Figure 7A:
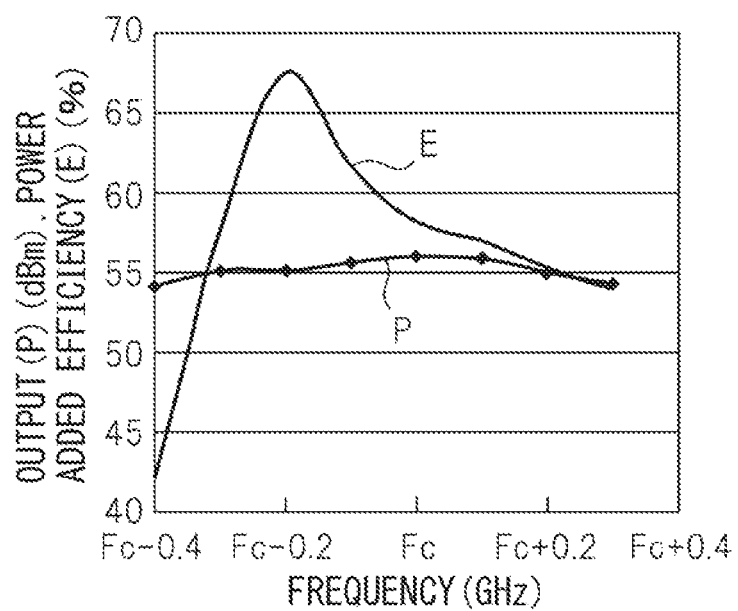
FIG. 7A is a diagram illustrating a measured characteristic of an amplifier having the circuit arrangement in the first embodiment and FIG. 7B is a diagram illustrating a measured characteristic of an amplifier having the circuit arrangement in FIG. 3, both the amplifiers being produced as prototypes.
Figure 7B:
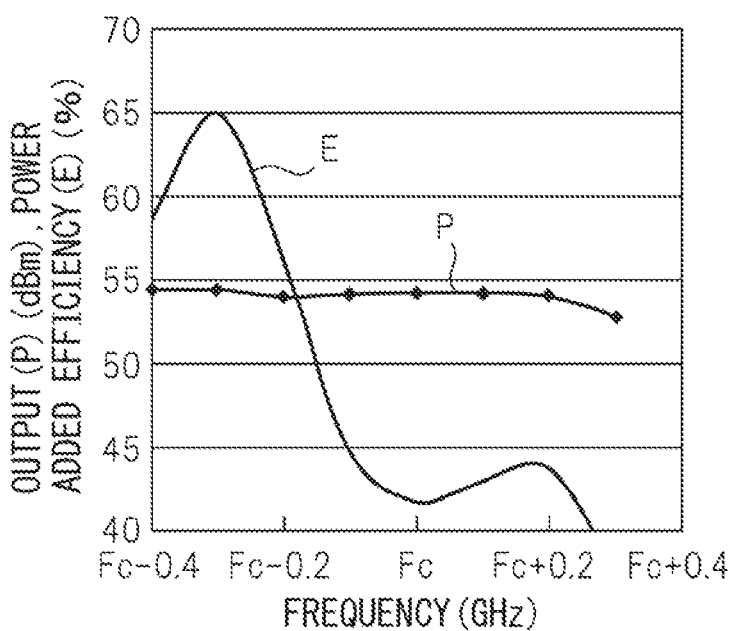

FIG. 7A is a diagram illustrating measured characteristics of a test-manufacturing amplifier having the circuit arrangement in the first embodiment and FIG. 7B is a diagram illustrating measured characteristics of a test-manufacturing amplifier having the circuit arrangement in FIG. 3 in order to confirm the effect of the circuit arrangement in the first embodiment.

As illustrated in FIG. 7B, in the circuit arrangement in FIG. 3, the performance (output (P), power added efficiency (E)) in high frequencies is reduced. This is because the cancel-out of the signals immediately after output from the chips becomes remarkable in high frequencies in the output matching circuit 30. On the other hand, as illustrated in FIG. 7A, in the circuit arrangement in the first embodiment, the cancel-out of signals immediately output from the chips is reduced and further, it is made possible to fine-adjust the characteristics, and therefore, it is known that the output and power added efficiency increase and the band is widened due to the improvement of the characteristics in high frequencies. Due to this, the effect in the first embodiment has been confirmed.

Figure 8:
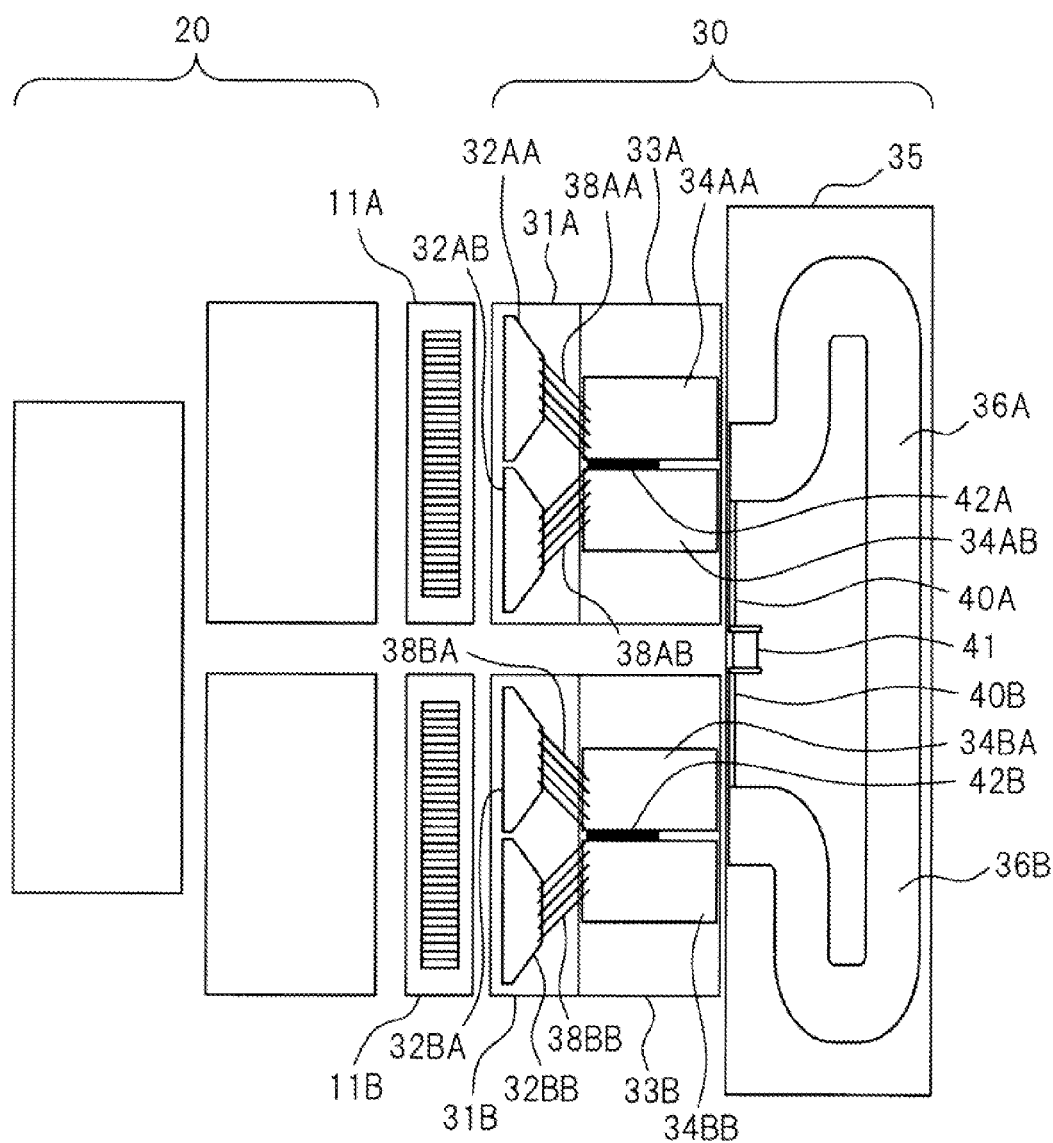
FIG. 8 is a diagram illustrating a circuit arrangement of an integrated circuit mounted device in a second embodiment.

FIG. 8 is a diagram illustrating a circuit arrangement of an integrated circuit mounted device in a second embodiment.

The circuit arrangement in the second embodiment differs in that the low impedance line 34A is divided into two low impedance lines 34AA and 34AB and the low impedance line 34B is divided into two low impedance lines 34BA and 34BB in the first embodiment and others are the same. Between the two low impedance lines 34AA and 34AB, a resistor 42A is provided and between the two low impedance lines 34BA and 34BB, a resistor 42B is provided.

As the frequency increases and it becomes no longer possible to ignore the line width for the signal wavelength, a mode other than a desired signal propagation mode is excited, resulting in signal loss. In the second embodiment, in order to avoid this problem, the lines are formed into parallel lines. Further, by inserting the resistors 42A and 42B between the parallel lines, a problem, such as circuit oscillation due to the variation in packaging, is suppressed.

Figure 9:
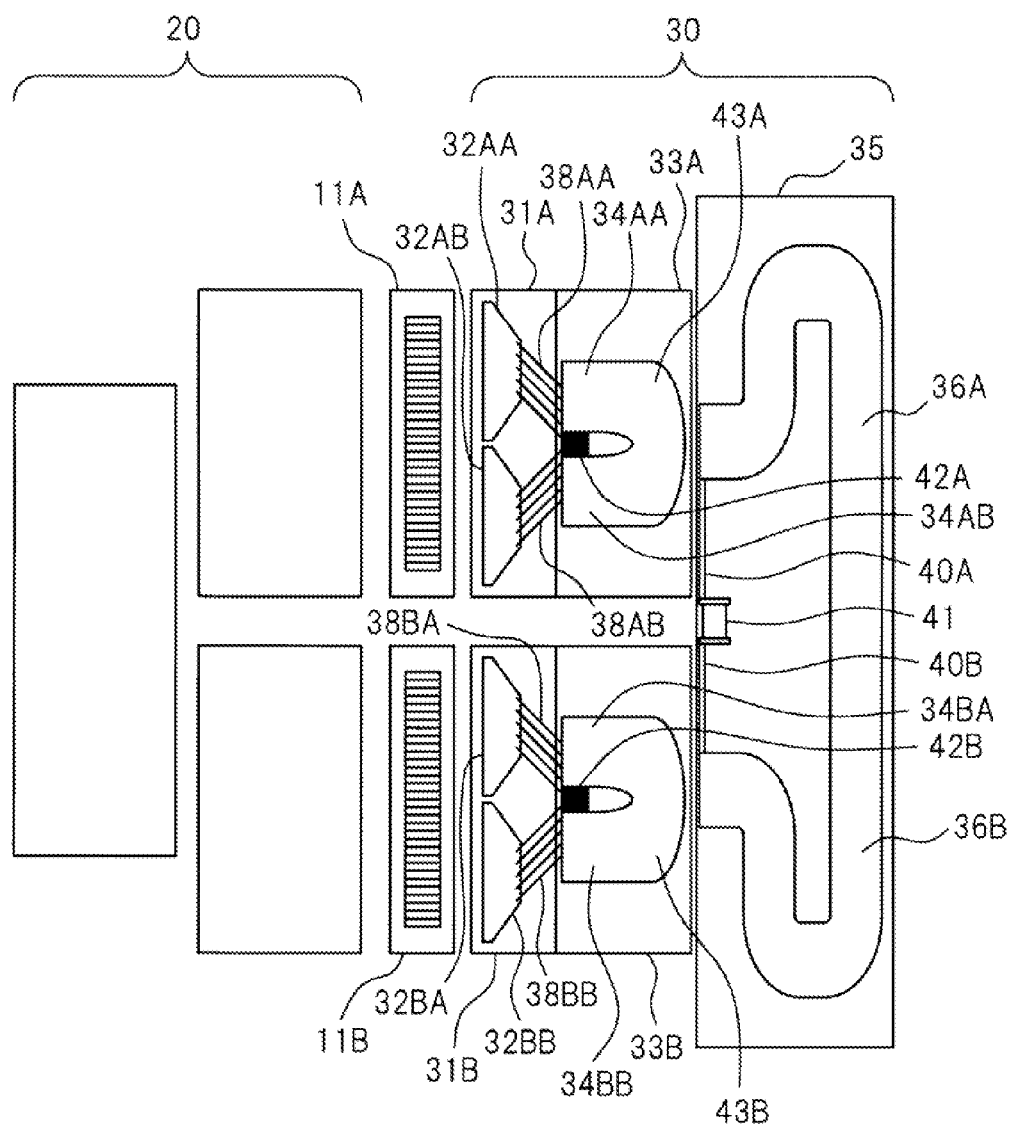
FIG. 9 is a diagram illustrating a circuit arrangement of the integrated circuit mounted device in the second embodiment.

FIG. 9 is a diagram illustrating a circuit arrangement of an integrated circuit mounted device in a third embodiment.

The circuit arrangement in the third embodiment differs in that a composing line 43A for composing the low impedance lines 34AA and 34AB and a composing line 43B for composing the low impedance lines 34BA and 34BB are provided in the second embodiment and others are the same. In the third embodiment also, in which between the two low impedance lines 34AA and 34AB, the resistor 42A is provided and between the two low impedance lines 34BA and 34BB, the resistor 42B is provided, the effect as that in the first embodiment may be obtained.

Figure 10:
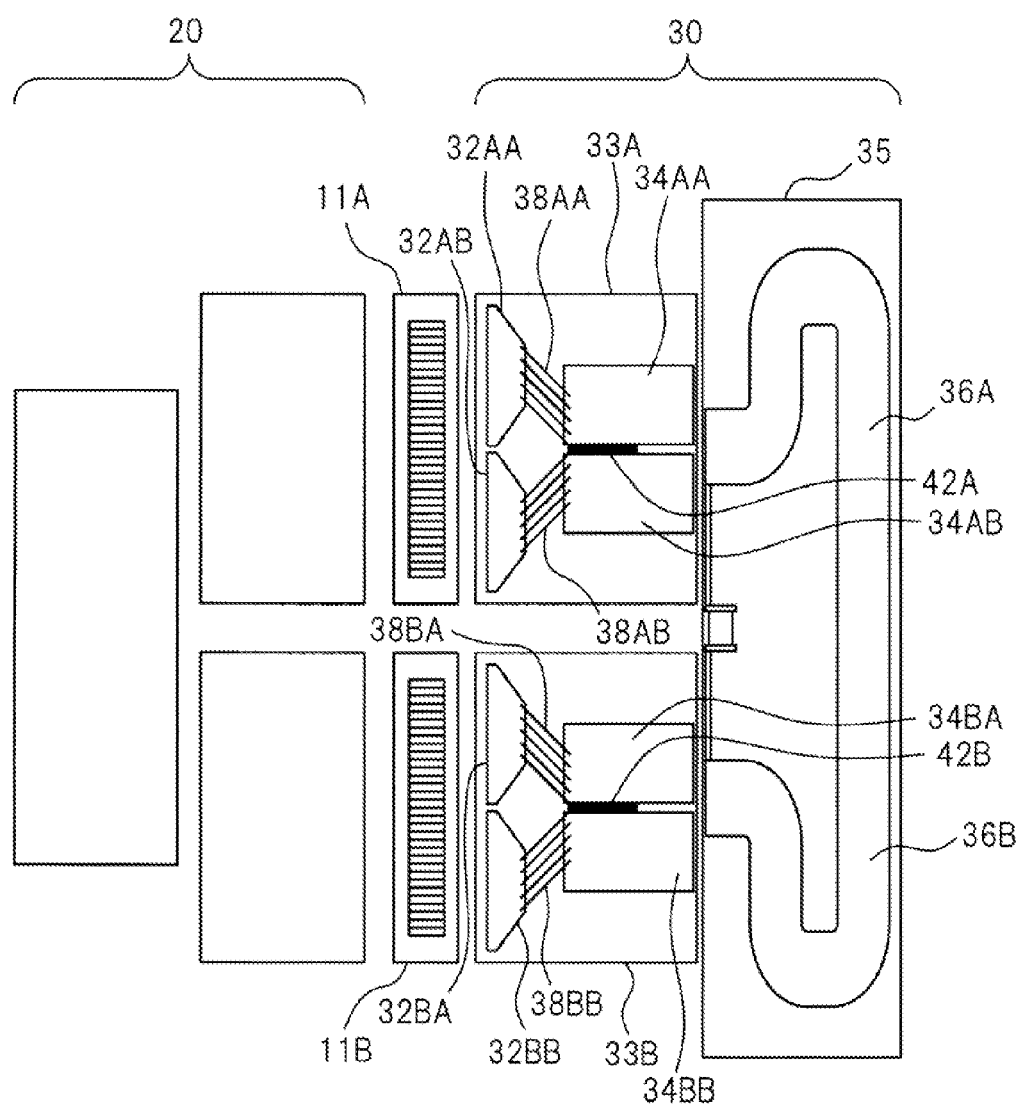
FIG. 10 is a diagram illustrating a circuit arrangement of an integrated circuit mounted device in a third embodiment.

FIG. 10 is a diagram illustrating a circuit arrangement of an integrated circuit mounted device in a fourth embodiment.

The circuit arrangement in the fourth embodiment differs in that the tapered lines 32AA, 32AB, 32BA, and 32BB are formed on the high dielectric constant substrates 33A and 33B on which the low impedance lines 34A and 34B are formed in the first embodiment and others are the same. Consequently, in the fourth embodiment, the low dielectric constant substrates 31A and 31 are not provided.

In the fourth embodiment also, the same effect as that in the first embodiment may be obtained.

Figure 11:
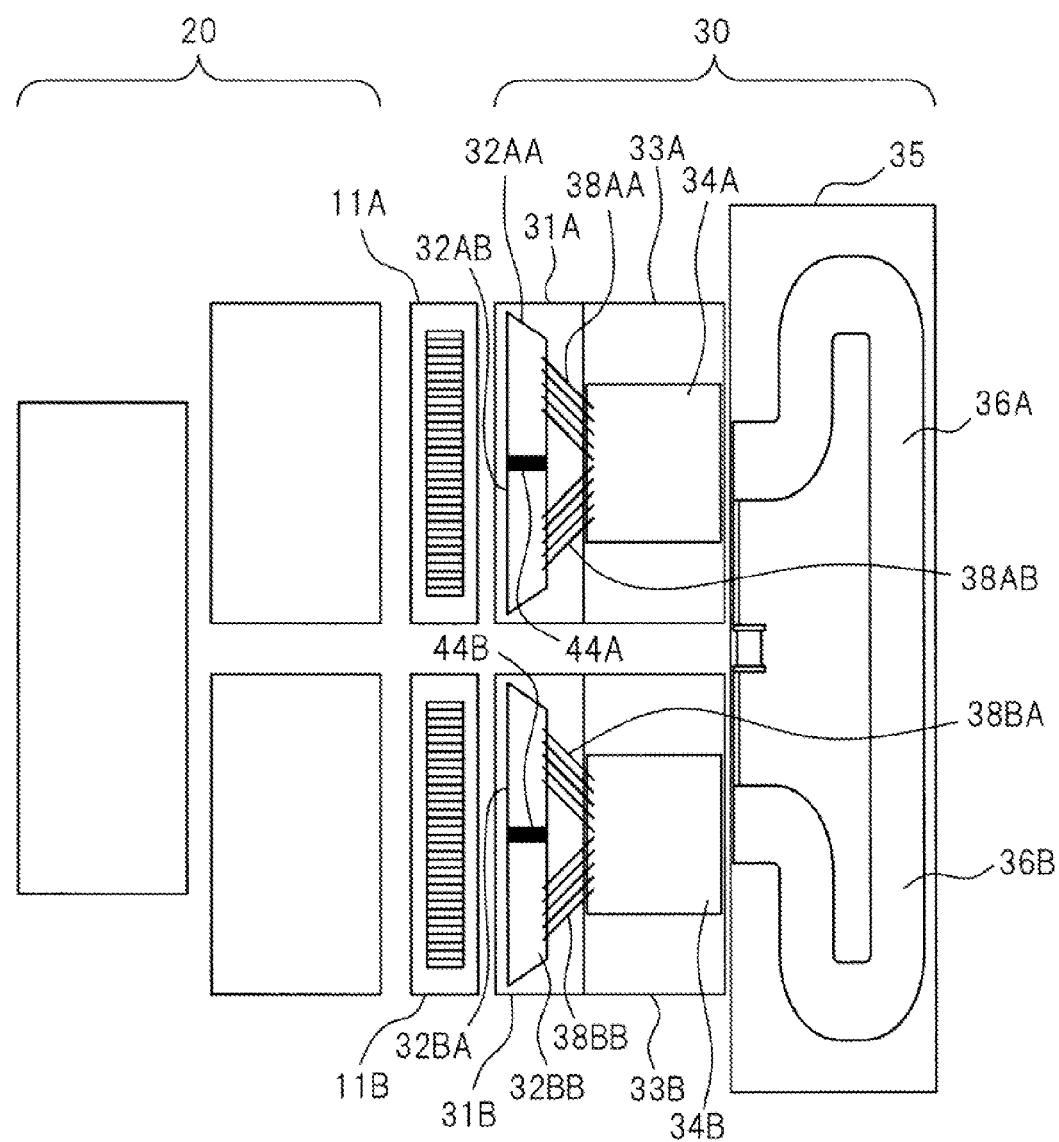
FIG. 11 is a diagram illustrating a circuit arrangement of an integrated circuit mounted device in a fourth embodiment.

FIG. 11 is a diagram illustrating a circuit arrangement of an integrated circuit mounted device in a fifth embodiment.

The circuit arrangement in the fifth embodiment differs in that the shapes of the tapered lines 32AA, 32AB, 32BA, and 32BB are formed into shapes of the tapered lines 32A and 32B illustrated in FIG. 3 divided into symmetric shapes about the centers, respectively, in the first embodiment and others are the same. It may also be possible to connect resistors 49A and 49B between the tapered lines 32AA and 32AB and between the tapered lines 32BA and 32BB. Due to this, it is possible to suppress trouble, such as circuit oscillation due to the variation in packaging.

In the fifth embodiment also, the same effect as that in the first embodiment may be obtained.

Figure 12:
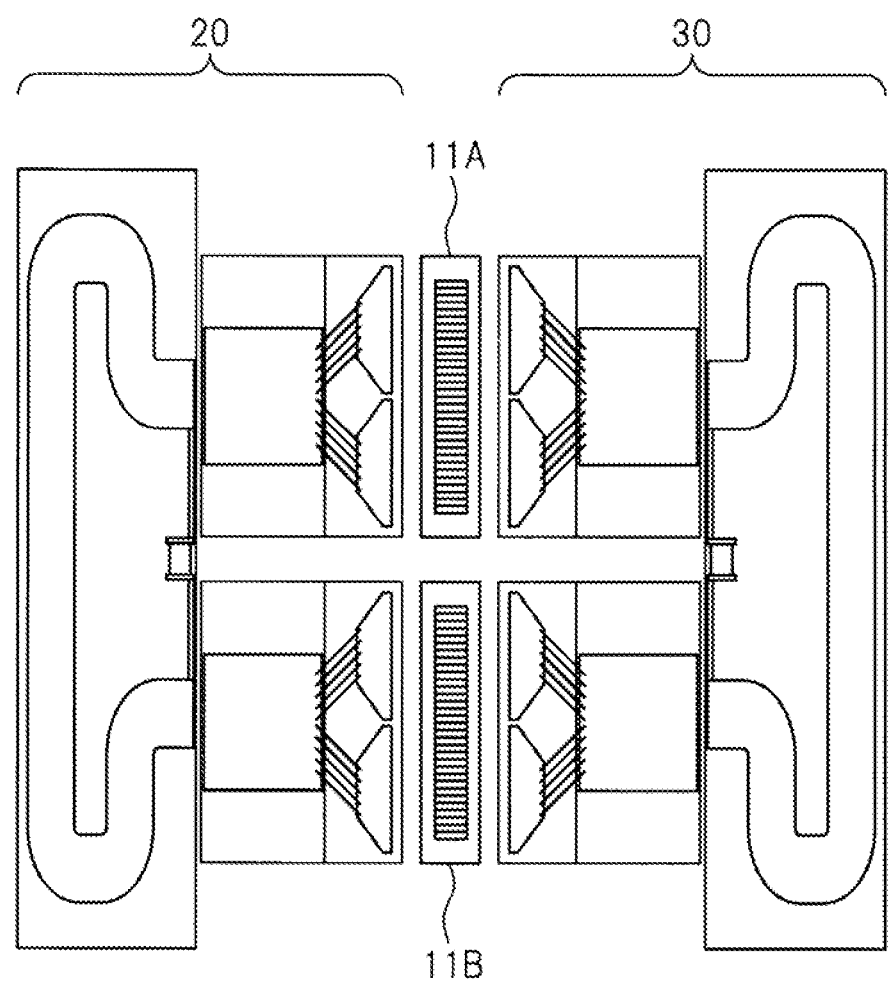
FIG. 12 is a diagram illustrating a circuit arrangement of an integrated circuit mounted device in a fifth embodiment.

FIG. 12 is a diagram illustrating a circuit arrangement of an integrated circuit mounted device in a sixth embodiment.

The circuit arrangement in the sixth embodiment differs from that in the first embodiment in that the same arrangement as that of the output matching circuit 30 in the first embodiment is applied also to the input matching circuit 20. The configuration and operation in the input matching circuit 20 are symmetric with those of the output matching circuit 30 with respect to the chips 11A and 11B, and therefore, its explanation is omitted.

The circuit arrangements of the integrated circuit mounted devices in the embodiments are explained as above, however, there may also be various modified examples. For example, in the explanation described above, the example of the low impedance line having a linear (rectangular) planar shape is explained, however, it is also possible to form it into a tapered shape.

Figure 13:
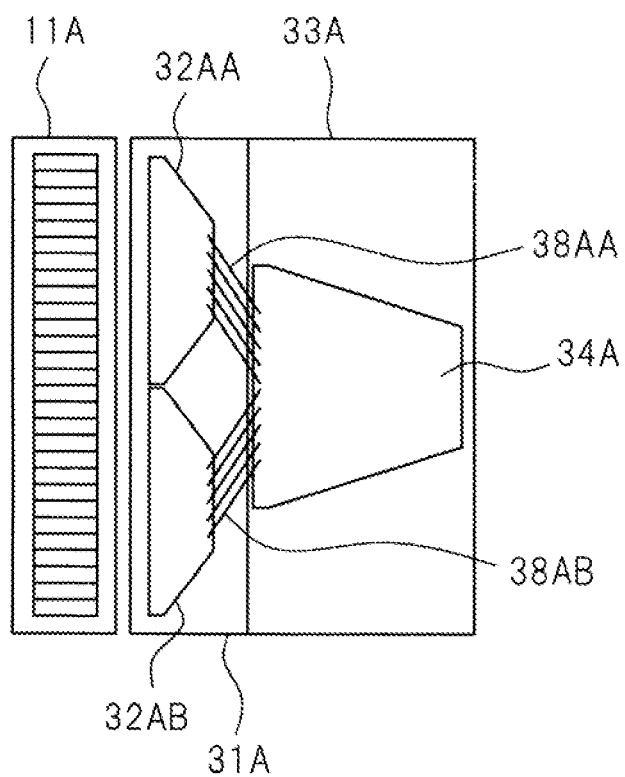
FIG. 13 illustrates a modified example when a low impedance line is formed into a tapered shape in the circuit arrangement in the fourth embodiment.

FIG. 13 illustrates a modified example, in which the low impedance line 34A is formed into a tapered shape in the circuit arrangement in the fourth embodiment.

Further, the configuration of the output matching circuit 30 explained in the second to fifth embodiments may also be applied to the input matching circuit 20. Further, it is also possible to apply the configuration in the embodiment explained above only to the input matching circuit or to apply different configurations to the output matching circuit 30 and the input matching circuit 20, or to apply a combination thereof.

Further, in the embodiments, the GaN transistor is used, however, it is also possible to use transistors using Si, GaAs, InP, etc. In the embodiments, the chip and the matching circuit substrate are packaged using AuSn, however, it may also be possible to package them using a conductive adhesive. In this case, it is possible to package at 200° C. or less, and therefore, it is possible to suppress cracks resulting from a difference in thermal expansion coefficient between the package and the chip, matching circuit substrate, and capacitor and yields may be improved. Further, it is possible to package a device, such as InP, the heat resistance of which is comparatively poor, without deteriorating the characteristics. Furthermore, it is possible to apply a material, such as copper, having a large thermal expansion coefficient difference of the package material, excellent in heat dissipation properties, and therefore, it is possible to realize a circuit with a higher output.

As explained above, according to the embodiments, it is made possible to reduce loss in the impedance conversion circuit and further to fine-adjust the characteristics of the impedance conversion circuit, and therefore, it is possible to realize an integrated circuit device at low cost by improving yields, which has higher performance, such as higher output, higher efficiency, and wider band.

Next, an application example of the integrated circuit device described above is explained.

Figure 14:
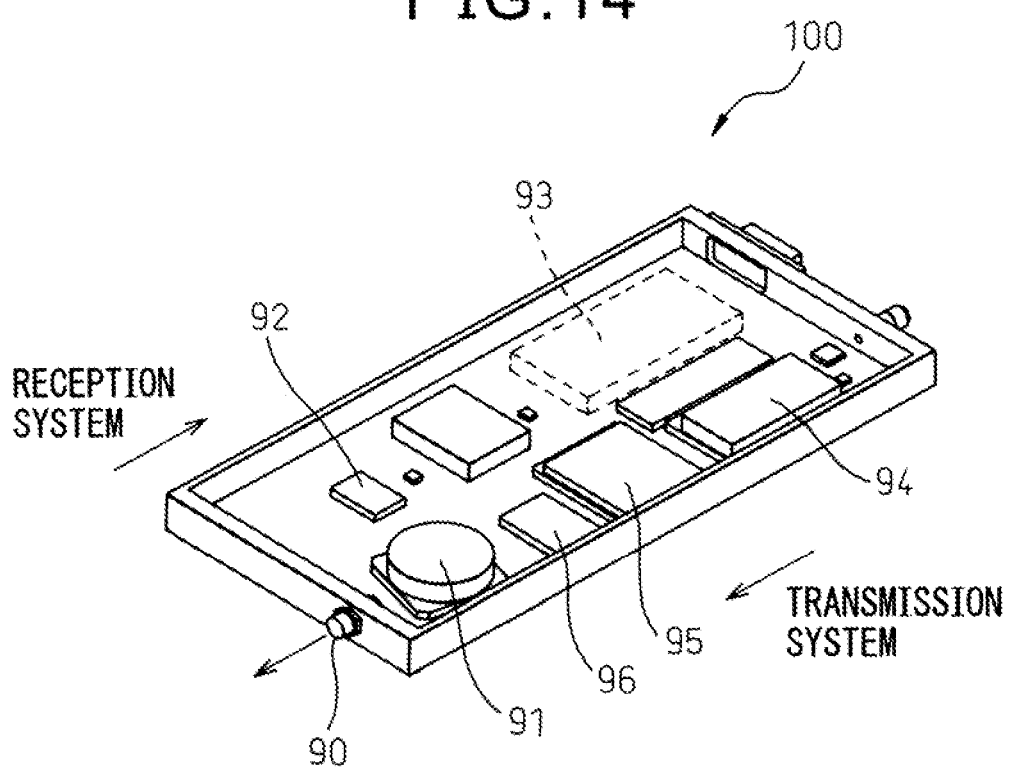
FIG. 14 is a diagram illustrating a configuration of a communication device module using a high-output amplifier circuit device.

FIG. 14 is a diagram illustrating a configuration of a communication device module 100 using the high-output amplifier circuit device in the embodiment.

As illustrated in FIG. 14, the communication device module 100 includes an input/output terminal 90 connected to an antenna, a transmission/reception switching device 91 connected with the input/output terminal 90, a low-noise amplifier 92, a control circuit 93, a previous stage amplifier 94, a high-output amplifier 95, and a filter 96.

The row on the front-right side in FIG. 14 configures a transmission system and the rear-left side configures a reception system. An input signal from the input/output terminal 90 is selectively sent to the low-noise amplifier 92 by the transmission/reception switching device 91 and reception processing is performed. On the other hand, a transmission signal amplified in the previous-stage amplifier 94 is further amplified by the high-output amplifier 95 and selectively sent to the input/output terminal 90 by the transmission/reception switching device 91 through the filter 96 and transmitted from the antenna. As the high-output amplifier 95, the high-output amplifier circuit device in the embodiment is used. It is needless to say that the high-output amplifier circuit device in the embodiment may be used not only in the transmission/reception communication module device but also in the transmission communication device module.

The communication device module 100 in FIG. 14 is used as part of a system device, such as a communication system, radar, sensor, and radio interference unit. When mounted in various kinds of devices, the high-performance, compact high-output amplifier circuit device in the embodiment may contribute to the improvement of performance and downsizing of a device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission line comprising:
    two tapered lines having a tapered planar shape and arranged in parallel;
    an opposite line provided in opposition to the narrower width sides of the two tapered lines; and
    bonding wires for connecting the narrower width sides of the two tapered lines and the opposite line, wherein
    the distance between two outer edges on the narrower width sides of the two tapered lines arranged in parallel is greater than the distance between outer edges on the opposite side of the opposite line in opposition to the narrower width sides of the two tapered lines.

2. The transmission line according to claim 1, wherein
    the opposite line includes one opposite line, and
    the distance between two outer edges on the narrower width sides of the two tapered lines arranged in parallel is greater than the width on the opposite side of the one opposite line.

3. The transmission line according to claim 1, wherein
    the opposite line includes two opposite lines, and
    the distance between outer edges on the narrower width sides of the two tapered lines arranged in parallel is greater than the distance between two outer edges on the opposite side of the two opposite lines.

4. The transmission line according to claim 1, wherein
    the opposite line has a rectangular planar shape.

5. The transmission line according to claim 1, wherein
    the opposite line has a tapered planar shape.

6. The transmission line according to claim 1, wherein
    the bonding wires comprise a first set and a second set,
    a plurality of wires in the first set extends in a first direction in parallel with one another when projected on the plane of the opposite line, and
    a plurality of wires in the second set extends in a second direction in parallel with one another, the second direction being different from the first direction when projected on the plane of the opposite line.

7. The transmission line according to claim 1, wherein
    the two tapered lines are formed on a high dielectric substrate, and
    the opposite line is a low impedance line formed on a high dielectric substrate.

8. The transmission line according to claim 1, wherein
    the two tapered lines are formed on a low dielectric constant substrate,
    the opposite line is a low impedance line formed on a high dielectric constant substrate.

9. The transmission line according to claim 8, further comprising a high impedance line formed on a low dielectric constant substrate, the dielectric constant of which is lower than that of the high dielectric constant substrate on which the opposite line is formed and to which the opposite line is to be connected, wherein
    the opposite line is connected to the high impedance line, and
    the transmission line forms an impedance conversion circuit.

10. An integrated circuit mounted device, comprising;
    an integrated circuit; and
    a transmission line,
    the transmission line comprising:
        two tapered lines having a tapered planar shape and arranged in parallel;
        an opposite line provided in opposition to the narrower width sides of the two tapered lines; and
        bonding wires for connecting the narrower width sides of the two tapered lines and the opposite line, wherein
        the distance between two outer edges on the narrower width sides of the two tapered lines arranged in parallel is greater than the distance between outer edges on the opposite side of the opposite line in opposition to the narrower width sides of the two tapered lines.

11. The integrated circuit mounted device according to claim 10, wherein
    the transmission line is provided on the output side of the integrated circuit, and
    an output of the integrated circuit and the wider width sides of the two tapered lines of the transmission line are connected by bonding wires.

12. The integrated circuit mounted device according to claim 10, wherein
    the transmission line is provided on both the input side and the output side of the integrated circuit, and
    an input and an output of the integrated circuit and the wider width sides of the two tapered lines of the transmission line are connected by bonding wires.

13. The integrated circuit mounted device according to claim 11, wherein
    the integrated circuit comprises a plurality of transistors arrayed in parallel with the wider width sides of the two tapered lines of the transmission line.

14. A communication device module, comprising:
    an integrated circuit mounted device that includes an integrated circuit and a transmission line, the transmission line comprising:
two tapered lines having a tapered planar shape and arranged in parallel;
an opposite line provided in opposition to the narrower width sides of the two tapered lines; and
bonding wires for connecting the narrower width sides of the two tapered lines and the opposite line, wherein
the distance between two outer edges on the narrower width sides of the two tapered lines arranged in parallel is greater than the distance between outer edges on the opposite side of the opposite line in opposition to the narrower width sides of the two tapered lines.

* * * * *